(12) United States Patent
Yum

(10) Patent No.: US 10,473,532 B2
(45) Date of Patent: Nov. 12, 2019

(54) METHOD AND APPARATUS FOR POWER MANAGEMENT

(71) Applicant: Samsung Electronics Co., Ltd., Gyeonggi-do (KR)

(72) Inventor: Jongwon Yum, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 473 days.

(21) Appl. No.: 14/966,295

(22) Filed: Dec. 11, 2015

(65) Prior Publication Data

US 2016/0178456 A1  Jun. 23, 2016

(30) Foreign Application Priority Data

Dec. 19, 2014  (KR) .................. 10-2014-0184996

(51) Int. Cl.
*G01K 13/00* (2006.01)
*H04W 52/02* (2009.01)
(Continued)

(52) U.S. Cl.
CPC .............. *G01K 13/00* (2013.01); *H03F 1/52* (2013.01); *H03F 3/189* (2013.01); *H03F 3/24* (2013.01); *H03F 3/72* (2013.01); *H04W 52/0251* (2013.01); *H03F 2200/321* (2013.01); *H03F 2200/411* (2013.01); *H03F 2200/447* (2013.01);
(Continued)

(58) Field of Classification Search
CPC combination set(s) only.
See application file for complete search history.

(56) References Cited

U.S. PATENT DOCUMENTS

2004/0235438 A1\* 11/2004 Quilisch .............. H03G 3/3047
455/127.2
2005/0206455 A1\* 9/2005 Yamazaki ................. H03F 1/52
330/285

(Continued)

FOREIGN PATENT DOCUMENTS

EP    2 693 631 A2    2/2014
JP    2010-136565 A    6/2010
(Continued)

OTHER PUBLICATIONS

European Search Report, dated May 18, 2016.
International Search Report, dated May 4, 2016.
European Search Report dated Jun. 27, 2017.

*Primary Examiner* — Lisa M. Caputo
*Assistant Examiner* — Nasir U. Ahmed
(74) *Attorney, Agent, or Firm* — Cha & Reiter LLC.

(57) ABSTRACT

A method for use in an electronic device having an amplification unit, the method comprising: detecting a current temperature of the electronic device when the amplification unit is in a first state in which the amplification unit is operated in accordance with first control value; detecting whether the current temperature meets a threshold; identifying a second control value that is lower than the first control value, when the current temperature meets the threshold; and changing an amount of power supplied to the amplification unit by transitioning the amplification unit into a second state in which the amplification unit is operated in accordance with the second control value.

16 Claims, 5 Drawing Sheets

(51) Int. Cl.
  *H03F 1/52* (2006.01)
  *H03F 3/189* (2006.01)
  *H03F 3/24* (2006.01)
  *H03F 3/72* (2006.01)
  *H04B 1/04* (2006.01)

(52) U.S. Cl.
  CPC .............. *H03F 2200/468* (2013.01); *H03F 2203/7227* (2013.01); *H04B 2001/0416* (2013.01); *Y02D 70/1262* (2018.01)

(56) References Cited

U.S. PATENT DOCUMENTS

| | | |
|---|---|---|
| 2006/0030359 A1 | 2/2006 | Behzad et al. |
| 2007/0190952 A1* | 8/2007 | Waheed .............. H04B 1/0475 455/114.3 |
| 2008/0186094 A1* | 8/2008 | Lee ..................... H03F 1/301 330/131 |
| 2008/0264383 A1* | 10/2008 | Omae ................ F02M 63/0015 123/445 |
| 2010/0244951 A1* | 9/2010 | Smith ................... H03G 3/004 330/127 |
| 2012/0264383 A1* | 10/2012 | Kondo ................ H03G 3/3042 455/127.2 |
| 2012/0306433 A1 | 12/2012 | Kim et al. |
| 2014/0028402 A1 | 1/2014 | An et al. |
| 2014/0032949 A1 | 1/2014 | Kim et al. |

FOREIGN PATENT DOCUMENTS

| | | |
|---|---|---|
| JP | 2011-101086 A | 5/2011 |
| KR | 10-2007-0014384 A | 2/2007 |
| KR | 10-1072197 B1 | 10/2011 |
| KR | 10-2012-0134030 A | 12/2012 |
| KR | 10-2014-0015880 A | 2/2014 |

* cited by examiner

METHOD AND APPARATUS FOR POWER MANAGEMENT

CLAIM OF PRIORITY

This application claims priority under 35 U.S.C. § 119(a) to a Korean Patent Application filed in the Korean Intellectual Property Office on Dec. 19, 2014 and assigned Serial No. 10-2014-0184996, the contents of which are herein incorporated by reference in its entirety.

TECHNICAL FIELD

The present disclosure relates to electronic devices in general, and more particularly to a method and apparatus for power management.

BACKGROUND

An electronic device such as a smartphone consumes more current in a 3G/LTE band than that consumed in a 2G band. For example, an electronic device may consume 200 mA when using a 2G band. In addition, the electronic device may consume 400 to 500 mA, more than that consumed when using the 2G band, when using a 3G band, and may consume 700 mA when using an LTE band.

SUMMARY

As power consumption of an electronic device becomes an issue, as described above, a method for improvement of power consumption is being highlighted. For example, a method of tuning the time constant may be used for improvement of power consumption. According to the method of tuning the time constant, when a call is generated, power consumption can be improved by using an LC time constant to improve power consumption or by tuning a PA output load. As another example, a method of controlling a VCC bias according to power levels [dBm] may be used for improvement of power consumption. As still another example, an envelope tracking modulator (ET modulator) may be used for improvement of power consumption.

The methods used for improvement of power consumption have limitations as follows. First, the method of tuning the time constant can slightly reduce power consumption. However, the method cannot reduce power consumption as much as necessary. In addition, the method of controlling a VCC bias according to power levels may increase interference with an adjacent channel when reducing power consumption. In addition, the method using an ET modulator can reduce power consumption as much as necessary, but the method is expensive. Accordingly, the need exists for new techniques for power management that address at least some of these limitations.

The present disclosure addresses this need. According to aspects of the disclosure, a method is provided for use in an electronic device having an amplification unit, the method comprising: detecting a current temperature of the electronic device when the amplification unit is in a first state in which the amplification unit is operated in accordance with a first control value; detecting whether the current temperature meets a threshold; identifying a second control value that is lower than the first control value, when the current temperature meets the threshold; and changing an amount of power used by the amplification unit by transitioning the amplification unit into a second state in which the amplification unit is operated in accordance with the second control value.

According to aspects of the disclosure, an apparatus comprising: a temperature sensing unit; an amplification unit; at least one processor configured to: detect, by the temperature sensing unit, a current temperature of the apparatus when the amplification unit is in a first state in which the amplification unit is operated in accordance with a first control value; detect whether the current temperature meets a threshold; identify a second control value that is lower than the first control value, when the current temperature meets the threshold; and change an amount of power used by the amplification unit by transitioning the amplification unit into a second state in which the amplification unit is operated in accordance with the second control value.

DETAILED DESCRIPTION

Hereinafter, various embodiments of the present disclosure are described with reference to the accompanying drawings. Here, it should be noted that the same components are indicated by the same reference numbers in the accompanying drawings. A detailed description of known functions and configurations will be omitted when it may obscure subject matter considered more pertinent. It should be noted that the following description will be given only about a part necessary to understand the operation of the present disclosure, and the other background technology will be omitted in order to prevent the subject matter of the present disclosure from being obscured.

Figure 1:
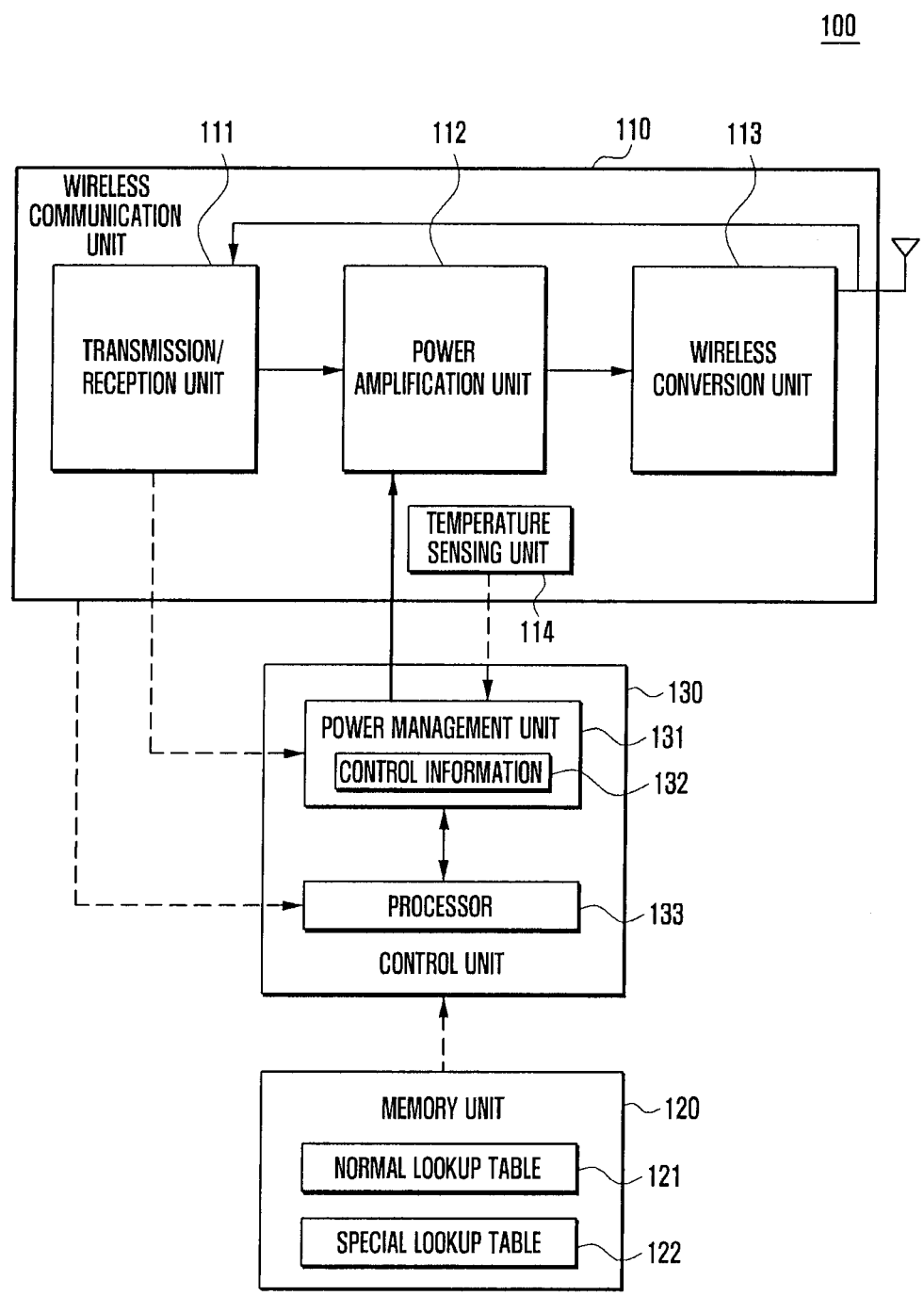
FIG. 1 is a diagram of an example of an electronic device, according to aspects of the present disclosure.

FIG. 1 is a diagram of an example of an electronic device, according to aspects of the present disclosure.

Referring to FIG. 1, an electronic device 100 may include a wireless communication unit 110, a memory unit 120, and a control unit 130. The following description will be given on the assumption that the dashed lines shown in FIG. 1 represent the flow of data, and the solid lines represent the flow of instructions.

The wireless communication unit 110 may include a transmission/reception unit 111, a power amplification unit 112, a wireless conversion unit 113, and a temperature sensing unit 114.

The transmission/reception unit 111 may transmit and receive data. Here, the data may be data transmitted from or received by the wireless communication unit 110. When transmitting call data, the transmission/reception unit 111 may supply power to the power amplification unit 112. In addition, the transmission/reception unit 111 may receive call data.

Especially, in accordance with an embodiment of the present disclosure, the transmission/reception unit 111 may transmit a control value corresponding to a target power [dBm] to a power management unit 131.

For example, the transmission/reception unit 111 may be a transceiver. The target power may be a power which is set to be suitable for each of a plurality of channels when the power amplification unit 112 performs a full sweep.

When receiving a signal from the transmission/reception unit 111, the power amplification unit 112 may amplify the received signal. For example, when connecting a call, the power amplification unit 112 may amplify a signal with power supplied from the transmission/reception unit 111.

For example, the power amplification unit 112 may be a power amplifier module (PAM).

More particularly, in accordance with an embodiment of the present disclosure, the power amplification unit 112 may operate in one of a lower mode and a high power mode. In addition, the power amplification unit 112 may amplify signals to a desired power level in accordance with a bias value corresponding to a supplied power (i.e. target power). When a power supply is driven, the power amplification unit 112 may be supplied with power determined based on a control value received from the power management unit 131. For example, the control value may be an integer which determines the amount of power supplied to the power amplification unit 112 (VCC voltage).

In addition, the power amplification unit 112 may transfer amplified signals to the wireless conversion unit 113.

When a plurality of bands exist, the wireless conversion unit 113 can open each band path in a predetermined order. The wireless conversion unit 113 may include a switch for connecting each band's respective path, as necessary.

For example, the wireless conversion unit 113 may be a First End Module integrated Duplex (FEMiD).

When receiving a signal, the wireless conversion unit 113 may form a connection with an antenna through the switch for a necessary band, and perform a wireless communication.

The temperature sensing unit 114 can sense a temperature of the electronic device 100. The temperature sensing unit 114 may be disposed adjacently to the power amplification unit 112. For example, in some embodiments, the temperature sensing unit 114 may be in physical (or thermal) contact with the power amplification unit. As another example, in some embodiments, the temperature sensing unit 114 may be disposed in close proximity to the power amplification unit 114. Such a configuration is intended to directly sense the temperature of the power amplification unit 112 by disposing the temperature sensing unit 114 to be adjacent to the power amplification unit 112 because the power amplification unit 112 is the component that generates the most heat when the electronic device 100 is used to conduct a telephone call (or another type of communications session). The temperature sensing unit 114 may transfer a sensed temperature to the power management unit 131.

For example, the temperature sensing unit 114 may be a thermistor.

The memory unit 120 may include any suitable type of volatile or non-volatile memory, such as Random Access Memory (RAM), Read-Only Memory (ROM), Network Accessible Storage (NAS), cloud storage, a Solid State Drive (SSD), etc. In accordance with an embodiment of the present disclosure, the memory unit 120 may store a normal lookup table 121 and a special lookup table 122. Information stored in the normal lookup table 121 and the special lookup table 122 may be retrievable by the control unit 130 from the memory unit 120.

Each row in the normal lookup table 121 and the special lookup table 122 may include a target power [dBm], a control value, a first amplification value, and a second amplification value.

The target power [dBm] may identify a power level which is suitable for each of a plurality of channels when the power amplification unit 112 performs a full-sweep.

The control value may include any suitable type of number, string, and/or alphanumerical identifier. For example, the control value may be "15". The control value may be transmitted from the transmission/reception unit 111 to the power management unit 131. The power management unit 131 may store control information 132 in its memory (e.g., a register, cache, etc.) The control information 132 may include at least a portion of the normal lookup table 121 and the special lookup table 122.

The first amplification value and the second amplification value may be bias voltages used for amplification by the power amplification unit 112.

The normal lookup table 121 may be a bias table which is applied when a temperature sensed by the temperature sensing unit 114 is lower than a preset temperature. Here, the preset temperature may be set by the manufacturer of the electronic device 100 or by the developer of software executed on the electronic device. The values in the normal lookup table 121 may be selected so as to minimize interference with an adjacent channel. The interference with an adjacent channel may be measured based on linearity. For example, linearity may be measured by using adjacent channel leakage ratio (ACLR) or spectrum emission mask (SEM).

The special lookup table 122 may be a bias table which is used when the temperature sensed by the temperature sensing unit 114 is equal to or higher than the preset temperature. The values special lookup table 122 may be selected so as to reduce power consumption. Thus, in some implementations, the normal lookup table 121 may optimized for reducing adjacent channel interference, whereas the specific lookup table may be optimized for minimizing power consumption.

The control unit 130 may include any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), etc. In some implementations, the control unit 130 may include the power management unit 131 and a processor 133.

The power management unit 131 may receive sensed temperature information from the temperature sensing unit 114. In addition, the power management unit 131 may detect whether or not the sensed temperature is equal to or higher than a preset temperature. For example, the preset temperature may be set by the manufacturer of the electronic device 100 or by the developer of software executed on the electronic device 100.

The power management unit 131 may detect a temperature change when the electronic device 100 is used to conduct a telephone call (or another type of communications session). When a call is initiated, the temperature of especially the power amplification unit 112 of the electronic device 100 may rise. Accordingly, when a call is initiated, the power management unit 131 may receive an indication that the temperature of the electronic device (and or a power amplification unit) has risen.

When detecting a rise in the temperature, the power management unit 131 may determine whether or not the sensed temperature is equal to or higher than a preset temperature.

When it is determined that the sensed temperature is equal to or higher than the preset temperature, the power management unit 131 may use the special lookup table 122. In contrast, when it is determined that the sensed temperature is lower than the preset temperature, the power management unit 131 may use the normal lookup table 121. That is to say, the power management unit 131 may appropriately use the special lookup table 122 or the normal lookup table 121 on the basis of a temperature sensed by the temperature sensing unit 114.

Specifically, when it is determined that a sensed temperature is equal to or higher than a preset temperature, the power management unit 131 may transmit an indication to this effect to the processor 133.

Upon receiving the indication that the sensed temperature is become equal to or higher than the preset temperature, the processor 133 may retrieve and transmit the special lookup table 122 to the power management unit 131.

In addition, when the processor receives an indication from the power management unit 131 that the measured temperature has fallen below the preset temperature, the processor 133 may retrieve and transmit the normal lookup table 121 to the power management unit 131.

FIG. 1 is provided only as an example. The configuration of the electronic device 100 is not limited to the aforementioned configuration. For example, although it is not shown in the drawing, the electronic device may be configured to additionally include a touch screen unit. The electronic device 100 may be a device, such as a smartphone, for supporting wireless data communications and voice calls.

Figure 2:
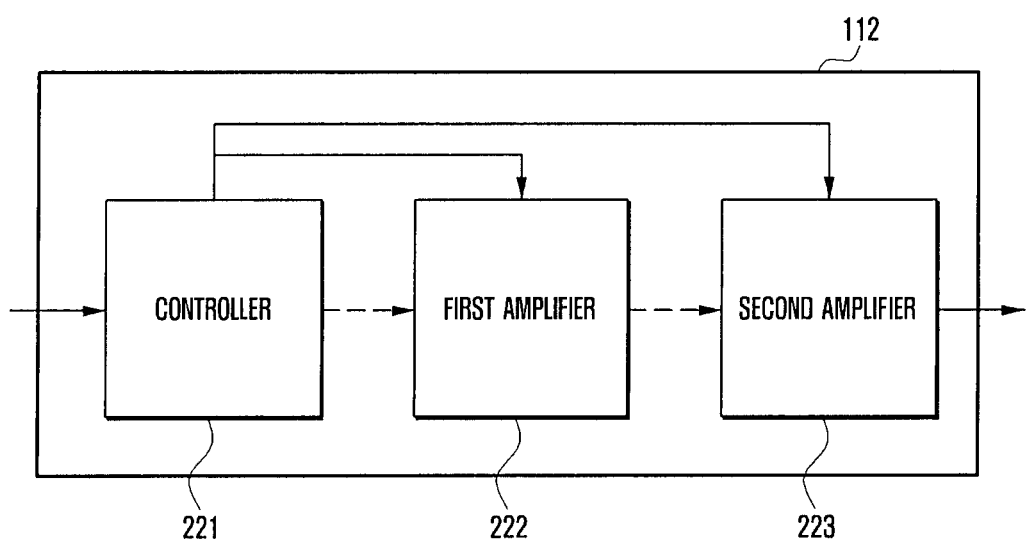
FIG. 2 is a diagram of an example of a power amplification unit, according to aspects of the present disclosure.

FIG. 2 is a diagram of an example of a power amplification unit, according to aspects of the present disclosure.

Referring to FIGS. 1 and 2, the power amplification unit 112 may be configured to include a controller 221, a first amplifier 222, and a second amplifier 223. The controller 221 may include any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), etc. Although in the present example the power amplification unit 112 includes two amplifier, in some implementations the power amplification unit 112 can include any suitable number of amplifiers (e.g., 1, 3, etc.)

When receiving power from the transmission/reception unit 111, the controller 221 can control a first amplification value and a second amplification value to be provided to the first amplifier 222 and second amplifier 223, respectively. For example, the first amplifier 222 and the second amplifier 223 may be BJT transistors. The first amplification value and second amplification value may be bias values that indicate the levels of respective bias signals that are applied to the first and second amplifiers, respectively.

The first amplifier 222 and second amplifier 223 may amplify signals by using the first amplification value and the second amplification value, respectively.

Figure 3:
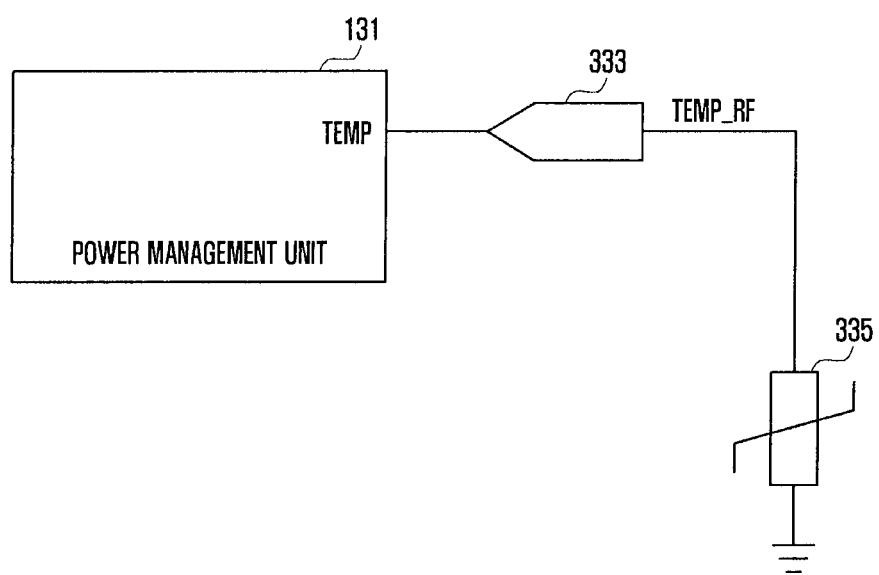
FIG. 3 is a diagram of an example of a circuit for improving of power consumption, according to aspects of the present disclosure.

FIG. 3 is a diagram of an example of a circuit for improving power consumption, according to aspects of the present disclosure.

Referring to FIG. 3, a temperature sensing unit 335 may sense a temperature varying in the power amplification unit 112 of FIG. 1. Here, the temperature sensing unit 335 may be coupled to an ACC terminal 333, and the ACC terminal 333 may be coupled to the power management unit 131. That is to say, the temperature sensing unit 335 may be coupled to the power management unit 131 through the ACC terminal 333 in order to be able to feed a signal indicating sensed temperature to the power management unit 131. For example, the temperature sensing unit 335 may be a thermistor.

Figure 4:
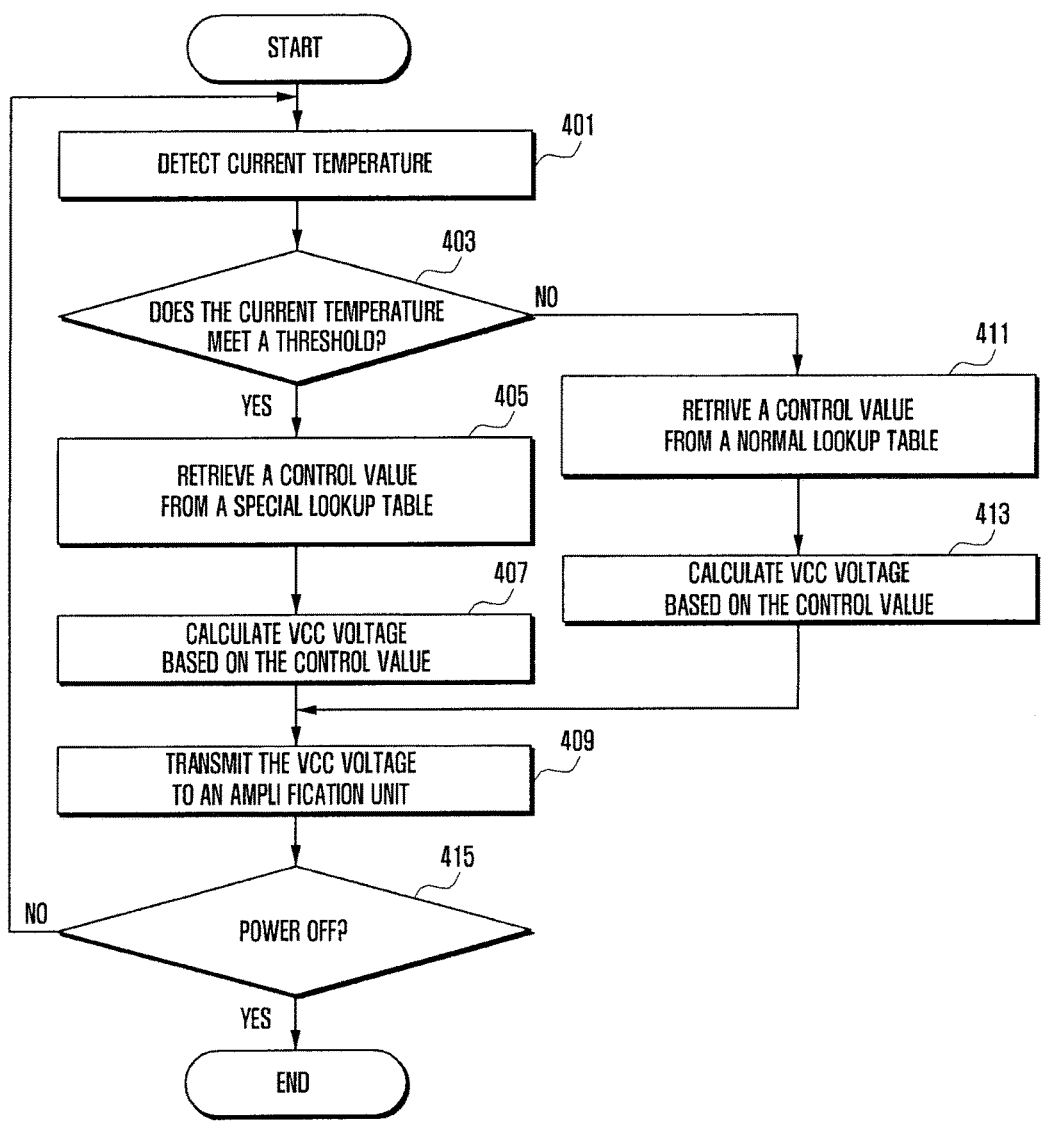
FIG. 4 is a flowchart of an example of a process, according to aspects of the present disclosure.

FIG. 4 is a flowchart of an example of a process, according to aspects of the present disclosure.

In operation 401, the power management unit 131 may use the temperature sensing unit 114 to detect the current temperature of the electronic device 100 (and/or the power amplification unit 112). The temperature sensing unit 114 may be used to sense a temperature change in the electronic device 100. In addition, the temperature sensing unit 114 may transmit an indication of the sensed temperature to the power management unit 131. For example, the temperature sensing unit 114 may sense a temperature increase in the electronic device 100 when a call (a data call or a voice call) is initiated in the electronic device 100. In addition, the temperature sensing unit 114 may sense a temperature decrease in the electronic device 100 when the call is terminated.

Next, in operation 403, the power management unit 131 may detect whether the current temperature meets a threshold. For example, the power management unit 131 may determine whether or not the sensed temperature is equal to or higher than a preset temperature at operation 403. Here, the preset temperature may be set by the manufacturer of the electronic device 100 or by the developer of software executed on the electronic device 100.

In operation, 405, when the threshold is met, the power management unit 131 may obtain the special lookup table 122 for improvement of power consumption under the control of the processor 133 and retrieve a control value from the obtained special lookup table.

The control value retrieved from the special lookup table may be associated with a particular target value that is set by the transmission/reception unit 111, and it may be lower than another control value that is associated with the same target value by the normal lookup table 121.

The power management unit 131 may set a control value to be low by tuning the time constant.

Table 1 shows an example of a special lookup table.

TABLE 1

| Temperature | Target Power [dBm] | Control Value | First Amplification Value | Second Amplification Value |
|---|---|---|---|---|
| 35° C. or higher | −50 | 15 | 4 | 5 |
| | −20 | 15 | 4 | 5 |
| | . | . | . | . |
| | . | . | . | . |
| | . | . | . | . |
| | 15 | 50 | 11 | 16 |
| | 16 | 55 | 11 | 17 |
| | . | . | . | . |
| | . | . | . | . |
| | . | . | . | . |
| | 21 | 87 | 13 | 20 |
| | 22 | 90 | 13 | 20 |
| | 23 | 100 | 13 | 25 |

In accordance with another embodiment of the present disclosure, for a particular target power value, the special lookup table 122 may include a first amplification value and a second amplification value which are lower than those included the normal lookup table 121 for improvement of power consumption. Through such a configuration, power consumption can be reduced while permitting target powers to remain the same.

The present disclosure is provided only as an example, and is not limited to the aforementioned embodiments.

In operation 407, the power management unit 131 may calculate a VCC voltage using the control value retrieved from the special lookup table 122.

Specifically, the power management unit 131 may calculate a control voltage VCtrl using the special lookup table 122. The control voltage may be calculated by using equation 1 below.

$$VCtrl = \frac{0.15 \times ControlValue \times (2.2 - 0.15)}{255}[V] \quad (1)$$

Next, a VCC voltage may be calculated using the control voltage VCtrl.

The VCC voltage may be calculated by using equation 2 below.

$$VCC = VCtrl \times 2.5 [V] \quad (2)$$

In operation 411, when the sensed temperature is not equal to or higher than the threshold temperature (i.e. when the current temperature does not meet the threshold), the power management unit 131 may obtain the normal lookup table 121, under the control of the processor 133. Afterwards, the power management unit 131 may retrieve a control value from the normal lookup table 121. The control value retrieved from the normal lookup table 121 may be associated with a particular target value that is set by the transmission/reception unit 111, and it may be higher than another control value that is associated with the same target value by the specific lookup table 122. The power management unit 131 may set a control value to be high by tuning the time constant.

Table 2 shows an example of a normal lookup table.

TABLE 2

| Temperature | Target Power [dBm] | Control Value | First Amplification Value | Second Amplification Value |
|---|---|---|---|---|
| Lower than 35° C. | −50 | 15 | 4 | 5 |
| | −20 | 15 | 4 | 5 |
| | . | . | . | . |
| | . | . | . | . |
| | . | . | . | . |
| | 15 | 50 | 11 | 16 |
| | 16 | 55 | 11 | 17 |
| | . | . | . | . |
| | . | . | . | . |
| | 21 | 87 | 13 | 20 |
| | 22 | 103 | 13 | 20 |
| | 23 | 110 | 13 | 25 |

In accordance with another embodiment of the present disclosure, the special lookup table 122 may include a first amplification value and a second amplification value which are higher than those included the normal lookup table 121 for improvement of interference with an adjacent channel (i.e. for improvement of linearity (e.g. an ACLR or an SEM)).

In operation 413, the power management unit 131 may calculate a VCC voltage on the basis of the control value that is retrieved from the normal lookup table 121.

Specifically, the power management unit 131 may calculate a control voltage VCtrl using the normal lookup table 121. The power management unit 131 may calculate a control voltage using equation 1. Then, the power management unit 131 may calculate the VCC voltage using equation 2.

The power management unit 131 may maintain a state in which the normal lookup table 121 is used when the electronic device 100 is in a waiting state.

Thereafter, the power management unit 131 may transmit the VCC voltage, which has been calculated at operation 409, to the power amplification unit 112.

The power management unit 131 may determine the amount of power to be supplied to the power amplification unit 112 with the VCC value which has been calculated by using the aforementioned procedure.

Examples in which power consumption is improved when different lookup tables are applied depending on temperatures will be described with reference to the aforementioned tables and equations.

First, an example will be described in which a frequency band has 10,562 channels. In a state in which a temperature sensed by the temperature sensing unit 114 is lower than a threshold temperature, when a target power is 22.3 dBm, the power management unit 131 may calculate that current of 438 mA is consumed. In contrast, in a state in which a temperature sensed by the temperature sensing unit 114 is equal to or higher than the preset temperature, when a target power is 22.2 dBm, the power management unit 131 may calculate that current of 376 mA is consumed.

As another example, the description will be given on a frequency band having 10,700 channels. In a state in which a temperature sensed by the temperature sensing unit 114 is lower than a preset temperature, when a target power is 22.22 dBm, the power management unit 131 may calculate that current of 411 mA is consumed. In contrast, in a state in which a temperature sensed by the temperature sensing unit 114 is equal to or higher than the preset temperature, when a target power is 22.28 dBm, the power management unit 131 may calculate that current of 358 mA is consumed.

As still another example, the description will be given on a frequency band having 10,838 channels. In a state in which a temperature sensed by the temperature sensing unit 114 is lower than a preset temperature, when a target power is 22.4 dBm, the power management unit 131 may calculate that current of 485 mA is consumed. In contrast, in a state in which a temperature sensed by the temperature sensing unit 114 is equal to or higher than the preset temperature, when a target power is 22.5 dBm, the power management unit 131 may calculate that current of 425 mA is consumed.

As described above, in the same frequency band, when a temperature sensed by the temperature sensing unit 114 is lower than a preset temperature, the power management unit 131 may consume more current than when a temperature sensed by the temperature sensing unit 114 is equal to or higher than the preset temperature.

The power management unit 131 may determine whether or not a user input requesting the electronic device 100 to be powered off is generated by the processor 133 at operation 415.

The power management unit 131 repeats the aforementioned procedure until a user input requesting power-off is generated. That is to say, the power management unit 131 may continuously identify the temperature of the electronic device 100, and apply an appropriate lookup table according to a temperature change in the electronic device 100. Specifically, the power management unit 131 may use the special lookup table 122 when the temperature of the electronic device 100 is equal to or higher than a preset temperature (i.e., when the current temperature meets the threshold). In contrast, the power management unit 131 may use the normal lookup table 121 when the temperature of the electronic device 100 is not equal to and not higher than the preset temperature (i.e. when the current temperature does not meet the threshold).

Figure 5:
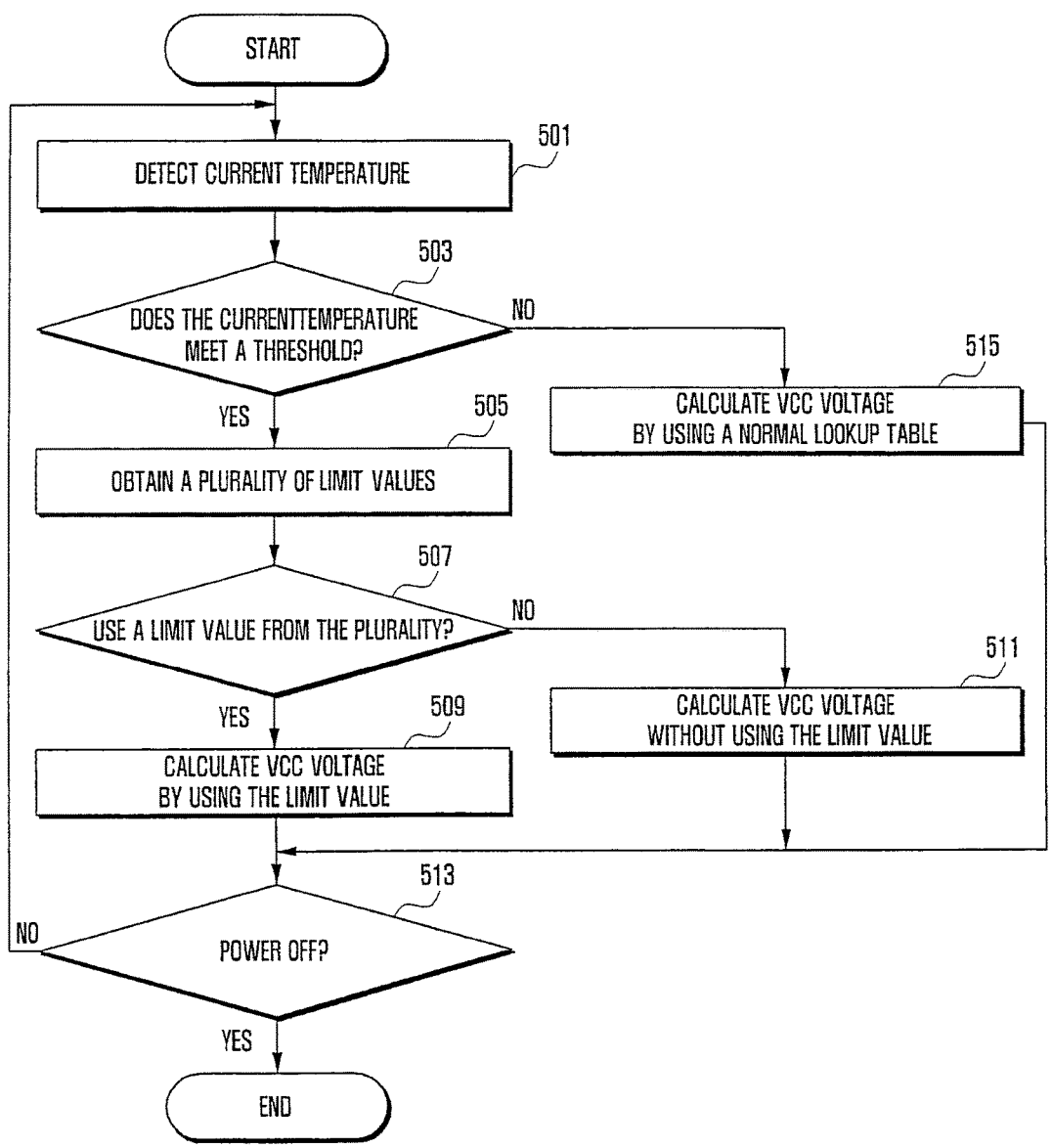
FIG. 5 is a flowchart of an example of a process, according to aspects of the present disclosure.

FIG. 5 is a flowchart of an example of a process, according to aspects of the disclosure.

In operation 501, the power management unit 131 may use the temperature sensing unit 114 to detect the current temperature of the electronic device 100 (and/or the power amplification unit 112). The temperature sensing unit 114 may sense a change in the temperature of the electronic device 100. In addition, the temperature sensing unit 114 may transmit the sensed temperature to the power management unit 131.

In operation 503, the power management unit 131 may detect whether the current temperature meets a threshold. For example, the power management unit 131 may determine whether or not the temperature sensed by the temperature sensing unit 114 is equal to or higher than a threshold temperature. For example, the preset temperature may be set by the manufacturer of the electronic device 100 or by the developer of software executed on the electronic device.

In operation 505, when the sensed temperature is equal to or higher than the threshold temperature, the power management unit 131 may obtain a plurality of limit values by retrieving from the memory 120 a table, such as table 3 shown below.

TABLE 3

| BAND | Frequency | Limit Value according to Each Frequency |
|---|---|---|
| BAND 1 | 19224 | −1.0 |
|  | 19524 | −1.0 |
|  | 19525 | 0.0 |
|  | 19644 | 0.0 |
|  | 19775 | 0.0 |
|  | 19776 | −1.0 |

In accordance with an embodiment of the present disclosure, the power management unit 131 may identify that a deviation exists in current consumed according to each frequency. Such a deviation in current consumed according to each frequency has a higher value at a higher temperature. Accordingly, the power management unit 131 can reduce the deviation of consumed current using limit values associated with different frequencies in the same band to reduce the deviation of current consumed according to each frequency in the same frequency band. For example, a limit value according to each frequency may be a headroom value.

When reference values according to frequencies are determined as shown in table 3, a target power having the same level (see tables 1 and 2) may be set to be used. In addition, the power management unit 131 may be set to use a target power of a previous level when a reference value according to each frequency is "−1.0", and the power management unit 131 may be set to use a target power of a next level when a reference value according to each frequency is "+1.0".

For example, in the same band (e.g. band 1), a target power of an equal level may be set to be used with respect to frequencies 19525, 19644 and 19775.

In operation 507, the power management unit 131 may determine whether one of the plurality of limit values needs to be used for determining VCC voltage. For example, the power management unit 131 may determine whether or not it is necessary to vary the target power according to a limit value for each frequency through table 3.

For example, the power management unit 131 may use a target power of 23 dBm for channel 19525 in a band (e.g. band 1). The power management unit 131 may control a target power of one previous level to be used according to reference values for each frequency under the control of the processor 133. This is because the deviation in power consumption is high as compared with another channel 19524 in the same band (e.g. band 1). Therefore, the power management unit 131 may perform a control to use a target power, i.e. 22 dBm, of one previous level in order to reduce the deviation of power consumption between channels. Such target power values may be determined by making reference to tables 1 and 2, wherein the values are only illustrative, and the present disclosure is not limited thereto.

In operation 509, the power management unit 131 may calculate the VCC voltage by using the limit value. The VCC voltage may be calculated by using either one of the normal table 121 and the special table 122.

In operation 511, the power management unit 131 may calculate the VCC voltage without using the limit value. The VCC voltage may be calculated by using either one of the normal table 121 and the special table 122.

In operation 515, when the current temperature fails to meet the threshold, the power management unit 131 may retrieve the normal lookup table 121. Afterwards, the power management unit 131 may calculate a VCC voltage on the basis of the normal lookup table 121 under the control of the processor 133.

At operation 513, the power management unit 131 may determine whether or not a user input requesting the electronic device 100 to be powered off is generated by the processor 133.

The power management unit 131 may repeat the aforementioned procedure until a user input requesting power-off is generated.

According to the method and apparatus for improvement of power consumption on heat generation of an electronic device in accordance with the embodiments of the present disclosure, a special table can be used when the electronic device is heated to a preset temperature or higher (i.e., when the current temperature of the electronic device meets a threshold). Accordingly, an electronic device according to the embodiments of the present disclosure can reduce power consumption, and simultaneously, can reduce interference with an adjacent channel.

FIGS. 1-5 are provided as an example only. At least some of the operations discussed with respect to these figures can be performed concurrently, performed in a different order, and/or altogether omitted. It will be understood that the provision of the examples described herein, as well as clauses phrased as "such as," "e.g.", "including", "in some aspects," "in some implementations," and the like should not be interpreted as limiting the claimed subject matter to the specific examples.

The above-described aspects of the present disclosure can be implemented in hardware, firmware or via the execution of software or computer code that can be stored in a recording medium such as a CD-ROM, a Digital Versatile Disc (DVD), a magnetic tape, a RAM, a floppy disk, a hard disk, or a magneto-optical disk or computer code downloaded over a network originally stored on a remote recording medium or a non-transitory machine-readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for".

While the present disclosure has been particularly shown and described with reference to the examples provided therein, it will be understood by those skilled in the art that various changes in form and details may be made therein without departing from the spirit and scope of the present disclosure as defined by the appended claims.

What is claimed is:

1. A method for use in an electronic device having an amplification unit, the method comprising:
   detecting a current temperature of the electronic device when the amplification unit is in a first state in which the amplification unit is operated in accordance with a first control value;
   detecting whether the current temperature exceeds a threshold;
   identifying a second control value that is designated for improving a current consumption according to heating in the electronic device when the current temperature exceeds the threshold, wherein the first and second control values are set to output same target power, wherein the second control value is lower than the first control value, and wherein power consumption corresponding to the first control value is higher than power consumption corresponding to the second control value; and
   changing an amount of power used by the amplification unit by transitioning the amplification unit into a second state in which the amplification unit is operated in accordance with the second control value,
   wherein the first control value is selected based on a first lookup table that is used to operate the amplification unit when the current temperature of the electronic device fails to exceed the threshold, and
   wherein the second control value is selected based on a second lookup table that is used to operate the amplification unit when the current temperature of the electronic device exceeds the threshold.

2. The method of claim 1, wherein transitioning the amplification unit into the second state includes:
   calculating a control voltage based on the second control value; and
   changing, based on the control voltage, a voltage level of a VCC signal that is transmitted to the amplification unit.

3. The method of claim 1, wherein:
   the amplification unit is biased using a VCC signal,
   a voltage level of the VCC signal is set based on the first lookup table when the current temperature of the electronic device fails to exceed the threshold, and
   the voltage level of the VCC signal is set based on the second lookup table when the current temperature of the electronic device exceeds the threshold.

4. The method of claim 1, wherein the amplification unit includes a first amplifier and a second amplifier, and transitioning the amplification unit into the second state comprises:
   lowering a bias of the first amplifier to a level that corresponds to the second control value, and
   lowering a bias of the second amplifier to a level that corresponds to the second control value.

5. The method of claim 1, further comprising transitioning the amplification unit from the second state back to the first state in response to detecting that the current temperature of the electronic device no longer exceeds the threshold.

6. The method of claim 1, wherein:
   the amplification unit includes a first amplifier and a second amplifier;
   the first lookup table associates a first plurality of target power values with respective bias levels for the first amplifier and the second amplifier; and
   the second lookup table associates a second plurality of target power values with respective bias levels for the first amplifier and the second amplifier, such that the respective bias levels associated with a given target power value by the second lookup table are lower than the respective bias levels associated with the given target power value by the first lookup table.

7. The method of claim 1, wherein transitioning the amplification unit into the second state includes lowering a voltage level of a VCC signal that is transmitted to the amplification unit based on the second control value.

8. The method of claim 1, wherein the threshold is met by the current temperature of the electronic device when the electronic device is used to conduct a telephone call.

9. An apparatus comprising:
   a temperature sensing unit;
   an amplification unit; and
   at least one processor configured to:
   detect, by the temperature sensing unit, a current temperature of the apparatus when the amplification unit is in a first state in which the amplification unit is operated in accordance with a first control value;
   detect whether the current temperature exceeds a threshold;
   identify a second control value that is designated for improving a current consumption according to heating in the apparatus when the current temperature exceeds the threshold, wherein the first and second control values are set to output same target power, wherein the second control value is lower than the first control value, and wherein power consumption corresponding to the first control value is higher than power consumption corresponding to the second control value; and
   change an amount of power used by the amplification unit by transitioning the amplification unit into a second state in which the amplification unit is operated in accordance with the second control value,
   wherein the first control value is selected based on a first lookup table, and the first lookup table is used to operate the amplification unit when the current temperature of the apparatus fails to exceed the threshold, and wherein the second control value is selected based on a second lookup table, and the second lookup table is used to operate the amplification unit when the current temperature of the apparatus exceeds the threshold.

10. The apparatus of claim 9, wherein:
the first lookup table associates a first plurality of target power values with respective control values, and
the second lookup table associates a second plurality of target power values with respective control values, such that the respective control values associated with a given target power value by the second lookup table are lower than the respective control values associated with the given target power value by the first lookup table.

11. The apparatus of claim 9, wherein transitioning the amplification unit into the second state includes:
calculating a control voltage based on the second control value; and
changing, based on the control voltage, a voltage level of a VCC signal that is transmitted to the amplification unit.

12. The apparatus of claim 9, wherein:
the amplification unit is biased using a VCC signal,
a voltage level of the VCC signal is set based on the first lookup table when the current temperature of the apparatus fails to exceed the threshold, and
the voltage level of the VCC signal is set based on the second lookup table when the current temperature of the apparatus exceeds the threshold.

13. The apparatus of claim 9, wherein the amplification unit comprises a first amplifier, a second amplifier, and a controller configured to:
lower a bias of the first amplifier to a level that corresponds to the second control value, and
lower a bias of the second amplifier to a level that corresponds to the second control value.

14. The apparatus of claim 9, wherein:
the amplification unit includes a first amplifier and a second amplifier;
the first lookup table associates a first plurality of target power values with respective bias levels for the first amplifier and the second amplifier; and
the second lookup table associates a second plurality of target power values with respective bias levels for the first amplifier and the second amplifier, such that the respective bias levels associated with a given target power value by the second lookup table are lower than the respective bias levels associated with the given target power value by the first lookup table.

15. The apparatus of claim 9, wherein transitioning the amplification unit into the second state includes lowering a voltage level of a VCC signal that is transmitted to the amplification unit based on the second control value.

16. The apparatus of claim 9, wherein the threshold is met by the current temperature of the apparatus when the apparatus is used to conduct a telephone call.

* * * * *